(12) United States Patent
Rölle et al.

(10) Patent No.: US 9,804,490 B2
(45) Date of Patent: Oct. 31, 2017

(54) HOLOGRAPHIC MEDIA WITH IMPROVED LIGHT SENSITIVITY

(71) Applicant: Covestro Deutschland AG, Leverkusen (DE)

(72) Inventors: Thomas Rölle, Leverkusen (DE); Horst Berneth, Leverkusen (DE); Friedrich-Karl Bruder, Krefeld (DE); Dennis Hönel, Zülpich-Wichterich (DE); Thomas Fäcke, Leverkusen (DE); Günther Walze, Leverkusen (DE); Rainer Hagen, Leverkusen (DE); Christian Diedrich, Düsseldorf (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

(21) Appl. No.: 15/105,138

(22) PCT Filed: Dec. 16, 2014

(86) PCT No.: PCT/EP2014/077878
§ 371 (c)(1),
(2) Date: Jun. 16, 2016

(87) PCT Pub. No.: WO2015/091427
PCT Pub. Date: Jun. 25, 2015

(65) Prior Publication Data
US 2016/0320695 A1     Nov. 3, 2016

(30) Foreign Application Priority Data

Dec. 20, 2013 (EP) .................................. 13198913

(51) Int. Cl.
G03H 1/04     (2006.01)
G03H 1/28     (2006.01)
(Continued)

(52) U.S. Cl.
CPC .............. *G03F 7/001* (2013.01); *G02B 1/04* (2013.01); *G03F 7/0046* (2013.01); *G03F 7/027* (2013.01);
(Continued)

(58) Field of Classification Search
None
See application file for complete search history.

(56) References Cited

U.S. PATENT DOCUMENTS 3,933,682 A * 1/1976 Bean .......................... C08F 2/50
430/916
4,113,592 A * 9/1978 Rybny ....................... C08F 2/50
430/281.1
(Continued)

FOREIGN PATENT DOCUMENTS

EP          132869     *  6/1984
EP      0223587 A1    5/1987
(Continued)

OTHER PUBLICATIONS

STN abstract for U.S. Pat. No. 3,933,683 (May 1984).*
International Search Report for PCT/EP2014/077878 mailed Feb. 26, 2015.

*Primary Examiner* — Martin Angebrannt
(74) *Attorney, Agent, or Firm* — Drinker Biddle & Reath LLP (57) ABSTRACT

The present invention provides a novel photopolymer formulation comprising matrix polymers, writing monomer and a photoinitiator and further comprising a compound of formula (1)

(Continued)

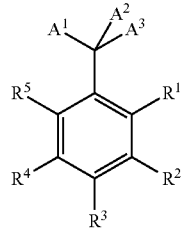

(I)

where $A^1$, $A^2$ and $A^3$ are each independently hydrogen, fluorine, chlorine, bromine or iodine, $R^1$, $R^2$, $R^3$, $R^4$ and $R^5$ are each independently hydrogen, halogen, cyano, nitro, amino, alkylimino, azide, isonitrile, enamino, formyl, acyl, carboxyl, carboxylate, carboxamide, orthoester, sulphonate, phosphate, organosulphonyl, organosulphoxidyl, optionally fluorinated alkoxy or an optionally substituted aromatic, heteroaromatic, aliphatic, araliphatic, olefinic or acetylenic radical while suitable radicals may be connected together via bridge of any desired substitution, or in that two or more compounds of formula (I) may be connected together via at least one of the radicals $R^1$, $R^2$, $R^3$, $R^4$ and $R^5$, in which case these radicals therein constitute a 2- to 4-tuply functional bridge, with the proviso that at least one of the radicals $R^1$, $R^2$, $R^3$, $R^4$ and $R^5$ is not hydrogen. Further subjects of the invention are a photopolymer comprising matrix polymers, a writing monomer and photoinitiator, a holographic medium comprising a photopolymer of the present invention or being obtainable by use thereof, the use of a holographic medium of the present invention and also a process for producing a holographic medium by using a photopolymer formulation of the present invention.

17 Claims, 2 Drawing Sheets (51) Int. Cl.
G03F 7/031 (2006.01)
G03F 7/027 (2006.01)
G03F 7/035 (2006.01)
G03F 7/00 (2006.01)
G03F 7/004 (2006.01)
G03F 7/029 (2006.01)
G03H 1/02 (2006.01)
G02B 1/04 (2006.01)
G11B 7/24044 (2013.01)

(52) U.S. Cl.
CPC .............. *G03F 7/029* (2013.01); *G03F 7/035* (2013.01); *G03H 1/02* (2013.01); *G03H 2001/0264* (2013.01); *G03H 2260/12* (2013.01); *G11B 7/24044* (2013.01)

(56) References Cited

U.S. PATENT DOCUMENTS

| 4,239,609 | A | * | 12/1980 | Barzynski | C08F 2/50 430/286.1 |
|---|---|---|---|---|---|
| 4,359,426 | A | * | 11/1982 | Dieterich | C07C 303/06 560/336 |
| 5,030,548 | A | * | 7/1991 | Fujikura | G03F 7/027 430/281.1 |
| 5,128,231 | A | * | 7/1992 | Itoh | G03F 7/038 430/270.1 |
| 5,168,032 | A | * | 12/1992 | Okamoto | G03F 7/029 430/270.1 |
| 5,208,133 | A | * | 5/1993 | Tsumori | G03F 7/0045 430/270.1 |
| 5,286,600 | A | * | 2/1994 | Ochiai | G03F 7/0045 430/270.1 |
| 6,087,062 | A | * | 7/2000 | Cunningham | C07F 5/027 430/270.1 |
| 9,057,950 | B2 | | 6/2015 | Rölle et al. | |
| 9,146,456 | B2 | | 9/2015 | Berneth et al. | |
| 2002/0142227 | A1 | * | 10/2002 | Dhar | G03F 7/001 430/1 |
| 2003/0064303 | A1 | * | 4/2003 | Nishimura | C08L 67/00 430/11 |
| 2003/0105263 | A1 | * | 6/2003 | Fan | C08G 18/0823 528/30 |
| 2005/0227166 | A1 | * | 10/2005 | Ichimura | G03F 7/0388 430/270.1 |
| 2005/0250016 | A1 | * | 11/2005 | Takeyama | G03F 7/001 430/1 |
| 2007/0172742 | A1 | * | 7/2007 | Yachi | G03F 7/001 430/1 |
| 2008/0268374 | A1 | * | 10/2008 | Tashiro | G03F 7/0045 430/280.1 |
| 2009/0103415 | A1 | * | 4/2009 | Usami | G03H 1/30 369/103 |
| 2010/0011672 | A1 | * | 1/2010 | Kincaid | B24D 11/001 51/295 |
| 2014/0255824 | A1 | | 9/2014 | Weiser et al. | |

FOREIGN PATENT DOCUMENTS

| EP | 747771 | * | 12/1996 |
| EP | 2450893 A1 | | 5/2012 |
| JP | 04-107560 | * | 4/1992 |
| JP | 09-179305 | * | 7/1997 |
| JP | 10-068814 | * | 3/1998 |
| WO | WO-2008/125229 A1 | | 10/2008 |
| WO | WO-2011095442 A1 | | 8/2011 |
| WO | WO-201262655 A2 | | 5/2012 |
| WO | WO 2013053771 A1 | | 4/2013 |

* cited by examiner

HOLOGRAPHIC MEDIA WITH IMPROVED LIGHT SENSITIVITY

CROSS-REFERENCE TO RELATED APPLICATIONS

This application is a national stage application (under 35 U.S.C. §371) of PCT/EP2014/077878, filed Dec. 16, 2014. which claims benefit of European Application No. 13198913.9, filed Dec. 20, 2013, both applications of which. are incorporated herein by reference in their entirety.

BACKGROUND

The present invention relates to a photopolymer formulation comprising matrix polymers, a writing monomer and a photoinitiator. Further subjects of the invention are a photopolymer comprising matrix polymers, a writing monomer and photoinitiator, a holographic medium comprising a photopolymer of the present invention, the use of a holographic medium of the present invention and also a process for producing a holographic medium by using a photopolymer formulation of the present invention.

Photopolymer formulations of the type mentioned at the beginning are known in the prior art. WO 2008/125229 A1 for instance describes a photopolymer formulation and a photopolymer obtainable therefrom which each comprise polyurethane matrix polymers, an acrylate-based writing monomer and also photoinitiators comprising a coinitiator and a dye. The uses of photopolymers are decisively determined by the refractive index modulation Δn produced by holographic exposure. In holographic exposure, the interference field of signal light beam and reference light beam (that of two plane waves in the simplest case) is mapped into a refractive index grating by the local photopolymerization of writing monomers such as, for example, high-refractive acrylates at loci of high intensity in the interference field. The refractive index grating in the photopolymer (the hologram) contains all the information of the signal light beam. Illuminating the hologram with only the reference light beam will then reconstruct the signal. The strength of the signal thus reconstructed relative to the strength of the incident reference light is called the diffraction efficiency, DE in what follows.

In the simplest case of a hologram resulting from the superposition of two plane waves, the DE is the ratio of the intensity of the light diffracted on reconstruction to the sum total of the intensities of diffracted light and nondiffracted light. The higher the DE, the greater the efficiency of a hologram with regard to the amount of reference light needed to visualize the signal with a fixed brightness.

In order that a very high Δn and DE may be realized for holograms, the matrix polymers and the writing monomers of a photopolymer formulation should in principle be chosen such that there is a very large difference in their refractive indices. One possible way to realize this is to use matrix polymers having a very low refractive index and writing monomers having a very high refractive index. Suitable matrix polymers of low refractive index are, for example, polyurethanes obtainable by reaction of a polyol component with a polyisocyanate component.

In addition to high DE and Δn values, however, another important requirement for holographic media from photopolymer formulations is that the matrix polymers be highly crosslinked in the final medium. When the degree of crosslinking is too low, the medium will lack adequate stability. One consequence of this is to appreciably reduce the quality of holograms inscribed in the media. In the worst case, the holograms may even be subsequently destroyed.

It is further very important, in particular for the large scale industrial production of holographic media from photopolymer formulations, that the photosensitivity be sufficient to achieve large-area exposure with any given source of laser light without loss of index modulation. Particularly the choice of a suitable photoinitiator here is of decisive importance for the properties of the photopolymer.

However, holographic exposure using a continuous source of laser light comes up against technical limits in the case of large-area exposure, since efficient formation of the hologram will always require a certain minimum of light per unit area and the technically available laser power is limited. Large-area exposures at a comparatively low dose of radiation additionally require long exposure times which in turn impose very high requirements on the mechanical damping of the exposure setup to eliminate vibration.

A further possible way to achieve large-area exposure of holograms consists in using very short pulses of light, for example from pulsed lasers or continuous wave lasers in conjunction with very fast shutters. Pulse durations with pulsed lasers are typically 500 ns or less. Pulse durations with continuous wave lasers and very fast shutters are typically 100 μs or less. In effect, the same amount of energy can be introduced here as with continuous lasers in seconds. Holograms can be written in this way dot by dot. Since pulsed lasers or fast optical shutters are technically available and an exposure set-up of this type has very low requirements with regard to mechanical damping to eliminate vibration, this amounts to a good technical alternative to the above-described set-ups involving continuous lasers for large-area exposure of holograms.

The photopolymers known from WO 2008/125229 A1 are by reason of the photoinitiators used therein insufficiently photosensitive to be useful in the writing of holograms with pulsed lasers.

BRIEF DESCRIPTION OF EMBODIMENTS

The problem addressed by the present invention was therefore that of providing a photopolymer formulation useful in the production of photopolymers whereinto holograms can be written with pulsed lasers by reason of higher photosensitivity.

This problem is solved by a photopolymer formulation comprising matrix polymers, writing monomer and a photoinitiator and further comprising a compound of formula (I)

where
$A^1$, $A^2$ and $A^3$ are each independently hydrogen, fluorine, chlorine, bromine or iodine,
$R^1$, $R^2$, $R^3$, $R^4$ and $R^5$ are each independently hydrogen, halogen, cyano, nitro, amino, alkylimino, azide, isonitrile, enamino, formyl, acyl, carboxyl, carboxylate, carboxamide, orthoester, sulphonate, phosphate, organosulphonyl, organosulphoxidyl, optionally fluorinated alkoxy or an optionally substituted aromatic, heteroaromatic, aliphatic, araliphatic, olefinic or acetylenic radical while suitable radicals may be connected together via bridge of any desired substitution, or in that two or more compounds of formula (I) may be connected together via at least one of the radicals $R^1$, $R^2$, $R^3$, $R^4$ and $R^5$, in which case these radicals therein constitute a 2- to 4-tuply functional bridge, with the proviso that at least one of the radicals $R^1$, $R^2$, $R^3$, $R^4$ and $R^5$ is not hydrogen.

This is because it was found that, surprisingly, media prepared from a photopolymer formulation of the present invention have a higher level of photosensitivity and hence are very useful for exposure using pulsed lasers.

In one preferred embodiment of the photopolymer formulation according to the present invention, the compound of formula (I) has $A^1$, $A^2$ and $A^3$ each independently fluorine, chlorine, bromine or iodine and more preferably $A^1$, $A^2$ and $A^3$ all either fluorine, chlorine, bromine or iodine.

In a likewise preferred embodiment, $R^1$, $R^2$, $R^3$, $R^4$ and $R^5$ in the compound of formula (I) are each independently hydrogen, halogen, cyano, nitro, isonitrile, acyl, carboxyl, carboxylate, carboxamide, orthoester, sulphonate, phosphate, organosulphonyl, organosulphoxidyl, optionally fluorinated alkoxy and preferably hydrogen, halogen, cyano, nitro, isonitrile, acyl, carboxyl, more preferably hydrogen, halogen and even more preferably hydrogen, fluorine, chlorine, bromine or iodine.

DETAILED DESCRPTION OF THE EMBODIMENTS

The matrix polymers of the photopolymer formulation according to the present invention may be particularly in a crosslinked state and more preferably in a three-dimensionally crosslinked state.

It is also advantageous for the matrix polymers to be polyurethanes, in which case the polyurethanes may be obtainable in particular by reacting at least one polyisocyanate component a) with at least one isocyanate-reactive component b).

The polyisocyanate component a) preferably comprises at least one organic compound having at least two NCO groups. These organic compounds may especially be monomeric di- and triisocyanates, polyisocyanates and/or NCO-functional prepolymers. The polyisocyanate component a) may also contain or consist of mixtures of monomeric di- and triisocyanates, polyisocyanates and/or NCO-functional prepolymers.

Monomeric di- and triisocyanates used may be any of the compounds that are well known per se to those skilled in the art, or mixtures thereof. These compounds may have aromatic, araliphatic, aliphatic or cycloaliphatic structures. The monomeric di- and triisocyanates may also comprise minor amounts of monoisocyanates, i.e. organic compounds having one NCO group.

Examples of suitable monomeric di- and triisocyanates are butane 1,4-diisocyanate, pentane 1,5-diisocyanate, hexane 1,6-diisocyanate (hexamethylene diisocyanate, HDI), 2,2,4-trimethylhexamethylene diisocyanate and/or 2,4,4-trimethylhexamethylene diisocyanate (TMDI), isophorone diisocyanate (IPDI), 1,8-diisocyanato-4-(isocyanatomethyl)octane, bis(4,4'-isocyanatocyclohexyl)methane and/or bis(2',4-isocyanatocyclohexyl)methane and/or mixtures thereof having any isomer content, cyclohexane 1,4-diisocyanate, the isomeric bis(isocyanatomethyl)cyclohexanes, 2,4- and/or 2,6-diisocyanato-1-methylcyclohexane (hexahydrotolylene 2,4- and/or 2,6-diisocyanate, $H_6$-TDI), phenylene 1,4-diisocyanate, tolylene 2,4- and/or 2,6-diisocyanate (TDI), naphthylene 1,5-diisocyanate (NDI), diphenylmethane 2,4'- and/or 4,4'-diisocyanate (MDI), 1,3-bis(isocyanatomethyl)benzene (XDI) and/or the analogous 1,4 isomers or any desired mixtures of the aforementioned compounds.

Suitable polyisocyanates are compounds which have urethane, urea, carbodiimide, acylurea, amide, isocyanurate, allophanate, biuret, oxadiazinctrione, uretdione and/or iminooxadiazinedione structures and are obtainable from the aforementioned di- or triisocyanates.

More preferably, the polyisocyanates are oligomerized aliphatic and/or cycloaliphatic di- or triisocyanates, it being possible to use especially the above aliphatic and/or cycloaliphatic di- or triisocyanates.

Very particular preference is given to polyisocyanates having isocyanurate, uretdione and/or iminooxadiazinedione structures, and biurets based on HDI or mixtures thereof.

Suitable prepolymers contain urethane and/or urea groups, and optionally further structures formed through modification of NCO groups as specified above. Prepolymers of this kind are obtainable, for example, by reaction of the abovementioned monomeric di- and triisocyanates and/or polyisocyanates a1) with isocyanate-reactive compounds b1).

Isocyanate-reactive compounds b1) used may be alcohols, amino or mercapto compounds, preferably alcohols. These may especially be polyols. Most preferably, isocyanate-reactive compounds b1) used may be polyester polyols, polyether polyols, polycarbonate polyols, poly(meth)acrylate polyols and/or polyurethane polyols.

Suitable polyester polyols are, for example, linear polyester diols or branched polyester polyols, which can be obtained in a known manner by reaction of aliphatic, cycloaliphatic or aromatic di- or polycarboxylic acids or anhydrides thereof with polyhydric alcohols of OH functionality ≥2. Examples of suitable di- or polycarboxylic acids are polybasic carboxylic acids such as succinic acid, adipic acid, suberic acid, sebacic acid, decanedicarboxylic acid, phthalic acid, terephthalic acid, isophthalic acid, tetrahydrophthalic acid or trimellitic acid, and acid anhydrides such as phthalic anhydride, trimellitic anhydride or succinic anhydride, or any desired mixtures thereof. The polyester polyols may also be based on natural raw materials such as castor oil. It is likewise possible that the polyester polyols are based on homo- or copolymers of lactones, which can preferably be obtained by addition of lactones or lactone mixtures, such as butyrolactone, ε-caprolactone and/or methyl-ε-caprolactone onto hydroxy-functional compounds such as polyhydric alcohols of OH functionality ≥2, for example of the abovementioned type.

Examples of suitable alcohols are all polyhydric alcohols, for example the $C_2$-$C_{12}$ diols, the isomeric cyclohexanediols, glycerol or any desired mixtures thereof.

Suitable polycarbonate polyols are obtainable in a manner known per se by reaction of organic carbonates or phosgene with diols or diol mixtures.

Suitable organic carbonates are dimethyl, diethyl and diphenyl carbonate.

Suitable diols or mixtures comprise the polyhydric alcohols of OH functionality ≥2 mentioned per se in the context of the polyester segments, preferably butane-1,4-diol, hexane-1,6-diol and/or 3-methylpentanodiol. It is also possible to convert polyester polyols to polycarbonate polyols.

Suitable polyether polyols are polyaddition products, optionally of blockwise structure, of cyclic ethers onto OH- or NH-functional starter molecules.

Suitable cyclic ethers are, for example, styrene oxides, ethylene oxide, propylene oxide, tetrahydrofuran, butylene oxide, epichlorohydrin, and any desired mixtures thereof.

Starters used may be the polyhydric alcohols of OH functionality ≥2 mentioned per se in the context of the polyester polyols, and also primary or secondary amines and amino alcohols.

Preferred polyether polyols are those of the aforementioned type based exclusively on propylene oxide, or random or block copolymers based on propylene oxide with further 1-alkylene oxides. Particular preference is given to propylene oxide homopolymers and random or block copolymers containing oxyethylene, oxypropylene and/or oxybutylene units, where the proportion of the oxypropylene units based on the total amount of all the oxyethylene, oxypropylene and oxybutylene units amounts to at least 20% by weight, preferably at least 45% by weight. Oxypropylene and oxybutylene here encompasses all the respective linear and branched $C_3$ and $C_4$ isomers.

Additionally suitable as constituents of the polyol component b1), as polyfunctional, isocyanate-reactive compounds, are also low molecular weight (i.e. with molecular weights ≤500 g/mol), short-chain (i.e. containing 2 to 20 carbon atoms), aliphatic, araliphatic or cycloaliphatic di-, tri- or polyfunctional alcohols.

These may, for example, in addition to the abovementioned compounds, be neopentyl glycol, 2-ethyl-2-butylpropanediol, trimethylpentanediol, positionally isomeric diethyloctanediols, cyclohexanediol, 1,4-cyclohexanedimethanol, 1,6-hexanediol, 1,2- and 1,4-cyclohexanediol, hydrogenated bisphenol A, 2,2-bis(4-hydroxycyclohexyl)propane or 2,2-dimethyl-3-hydroxypropyl 2,2-dimethyl-3-hydroxypropionate. Examples of suitable triols are trimethylolethane, trimethylolpropane or glycerol. Suitable higher-functionality alcohols are di(trimethylolpropane), pentaerythritol, dipentaerythritol or sorbitol.

It is especially preferable when the polyol component is a difunctional polyether, polyester, or a polyether-polyester block copolyester or a polyether-polyester block copolymer having primary OH functions.

It is likewise possible to use amines as isocyanate-reactive compounds b1). Examples of suitable amines are ethylenediamine, propylenediamine, diaminocyclohexane, 4,4'-dicyclohexylmethanediamine, isophoronediamine (IPDA), difunctional polyamines, for example the Jeffamines®, amine-terminated polymers, especially having number-average molar masses ≤10 000 g/mol. Mixtures of the aforementioned amines can likewise be used.

It is likewise possible to use amino alcohols as isocyanate-reactive compounds b1). Examples of suitable amino alcohols are the isomeric aminoethanols, the isomeric aminopropanols, the isomeric aminobutanols and the isomeric aminohexanols, or any desired mixtures thereof.

All the aforementioned isocyanate-reactive compounds b1) can be mixed with one another as desired.

It is also preferable when the isocyanate-reactive compounds b1) have a number-average molar mass of ≥200 and ≤10 000 g/mol, further preferably ≥500 and ≤8000 g/mol and most preferably ≥800 and ≤5000 g/mol. The OH functionality of the polyols is preferably 1.5 to 6.0, more preferably 1.8 to 4.0.

The prepolymers of the polyisocyanate component a) may especially have a residual content of free monomeric di- and triisocyanates of <1% by weight, more preferably <0.5% by weight and most preferably <0.3% by weight.

It is optionally also possible that the polyisocyanate component a) contains, entirely or in part, organic compound whose NCO groups have been fully or partly reacted with blocking agents known from coating technology. Example of blocking agents are alcohols, lactams, oximes, malonic esters, pyrazoles, and amines, for example butanone oxime, diisopropylamine, diethyl malonate, ethyl acetoacetate, 3,5-dimethylpyrazole, ε-caprolactam, or mixtures thereof.

It is especially preferable when the polyisocyanate component a) comprises compounds having aliphatically bonded NCO groups, aliphatically bonded NCO groups being understood to mean those groups that are bonded to a primary carbon atom. The isocyanate-reactive component b) preferably comprises at least one organic compound having an average of at least 1.5 and preferably 2 to 3 isocyanate-reactive groups. In the context of the present invention, isocyanate-reactive groups are regarded as being preferably hydroxyl, amino or mercapto groups.

The isocyanate-reactive component may especially comprise compounds having a numerical average of at least 1.5 and preferably 2 to 3 isocyanate-reactive groups.

Suitable polyfunctional isocyanate-reactive compounds of component b) are for example the above-described compounds b1).

In a further preferred embodiment, the writing monomer c) comprises or consists of at least one mono- and/or one multifunctional writing monomer. Further preferably, the writing monomer may comprise or consist of at least one mono- and/or one multifunctional (meth)acrylate writing monomer. Most preferably, the writing monomer may comprise or consist of at least one mono- and/or one multifunctional urethane (meth)acrylate.

Suitable acrylate writing monomers are especially compounds of the general formula (II)

in which n≥1 and n≤4 and $R^6$ is a linear, branched, cyclic or heterocyclic organic radical which is unsubstituted or else optionally substituted by heteroatoms and/or $R^7$ is hydrogen or a linear, branched, cyclic or heterocyclic organic radical which is unsubstituted or else optionally substituted by heteroatoms. More preferably, $R^7$ is hydrogen or methyl and/or $R^6$ is a linear, branched, cyclic or heterocyclic organic radical which is unsubstituted or else optionally substituted by heteroatoms.

Acrylates and methacrylates refer, respectively, to esters of acrylic acid and methacrylic acid. Examples of acrylates and methacrylates usable with preference are phenyl acrylate, phenyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, bisphenol A diacrylate, bisphenol A dimethacrylate, and the ethoxylated analogue compounds thereof, N-carbazolyl acrylates.

Urethane acrylates are understood to mean compounds having at least one acrylic ester group and at least one urethane bond. Compounds of this kind can be obtained, for example, by reacting a hydroxy-functional acrylate or methacrylate with an isocyanate-functional compound.

Examples of isocyanate-functional compounds usable for this purpose are monoisocyanates, and the monomeric diisocyanates, triisocyanates and/or polyisocyanates mentioned under a). Examples of suitable monoisocyanates are phenyl isocyanate, the isomeric methylthiophenyl isocyanates. Di-, tri- or polyisocyanates have been mentioned above, and also triphenylmethane 4,4',4"-triisocyanate and tris(p-isocyanatophenyl) thiophosphate or derivatives thereof with urethane, urea, carbodiimide, acylurea, isocyanurate, allophanate, biuret, oxadiazinetrione, uretdione, iminooxadiazinedione structure and mixtures thereof. Preference is given to aromatic di-, tri- or polyisocyanates.

Useful hydroxy-functional acrylates or methacrylates for the preparation of urethane acrylates include, for example, compounds such as 2-hydroxyethyl (meth)acrylate, polyethylene oxide mono(meth)acrylates, polypropylene oxide mono(meth)acrylates, polyalkylene oxide mono(meth)acrylates, poly(ε-caprolactone) mono(meth)acrylates, for example Tone® M100 (Dow, Schwalbach, DE), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxy-functional mono-, di- or tetraacrylates of polyhydric alcohols such as trimethylolpropane, glycerol, pentaerythritol, dipentaerythritol, ethoxylated, propoxylated or alkoxylated trimethylolpropane, glycerol, pentaerythritol, dipentaerythritol or the technical mixtures thereof. Preference is given to 2-hydroxyethyl acrylate, hydroxypropyl acrylate, 4-hydroxybutyl acrylate and poly(ε-caprolactone) mono(meth)acrylate.

It is likewise possible to use the fundamentally known hydroxyl-containing epoxy (meth)acrylates having OH contents of 20 to 300 mg KOH/g or hydroxyl-containing polyurethane (meth)acrylates having OH contents of 20 to 300 mg KOH/g or acrylated polyacrylates having OH contents of 20 to 300 mg KOH/g and mixtures thereof, and mixtures with hydroxyl-containing unsaturated polyesters and mixtures with polyester (meth)acrylates or mixtures of hydroxyl-containing unsaturated polyesters with polyester (meth)acrylates.

Preference is given especially to urethane acrylates obtainable from the reaction of tris(p-isocyanatophenyl) thiophosphate and/or m-methylthiophenyl isocyanate with alcohol-functional acrylates such as hydroxyethyl (meth) acrylate, hydroxypropyl (meth)acrylate and/or hydroxybutyl (meth)acrylate.

It is likewise possible that the writing monomer comprises or consists of further unsaturated compounds such as α,β-unsaturated carboxylic acid derivatives, for example maleates, fumarates, maleimides, acrylamides, and also vinyl ethers, propenyl ethers, allyl ethers and compounds containing dicyclopentadienyl units, and also olefinically unsaturated compounds, for example styrene, α-methylstyrene, vinyltoluene and/or olefins.

Photoinitiators of component d) are compounds activatable typically by means of actinic radiation, which can trigger polymerization of the writing monomers. In the case of the photoinitiators, a distinction can be made between unimolecular (type I) and bimolecular (type II) initiators. In addition, they are distinguished by their chemical nature as photoinitiators for free-radical, anionic, cationic or mixed types of polymerization.

Type I photoinitiators (Norrish type I) for free-radical photopolymerization form free radicals on irradiation through unimolecular bond scission. Examples of type I photoinitiators are triazines, oximes, benzoin ethers, benzil ketals, bisimidazoles, aroylphosphine oxides, sulphonium salts and iodonium salts.

Type II photoinitiators (Norrish type II) for free-radical polymerization consist of a dye as sensitizer and a coinitiator, and undergo a bimolecular reaction on irradiation with light matched to the dye. First of all, the dye absorbs a photon and transfers energy from an excited state to the coinitiator. The latter releases the polymerization-triggering free radicals through electron or proton transfer or direct hydrogen abstraction.

In the context of this invention, preference is given to using type II photoinitiators.

Photoinitiator systems of this kind are described in principle in EP 0 223 587 A and consist preferably of a mixture of one or more dyes with ammonium alkylarylborate(s).

Suitable dyes which, together with an ammonium alkylarylborate, form a type II photoinitiator are the cationic dyes described in WO 2012062655, in combination with the anions likewise described therein.

Cationic dyes are preferably understood to mean those from the following classes: acridine dyes, xanthene dyes, thioxanthene dyes, phenazine dyes, phenoxazine dyes, phenothiazine dyes, tri(het)arylmethane dyes—especially diamino- and triamino(het)arylmethane dyes, mono-, di-, triand pentamethinecyanine dyes, hemicyanine dyes, externally cationic merocyanine dyes, externally cationic neutrocyanine dyes, zeromethine dyes—especially naphtholactam dyes, streptocyanine dyes. Dyes of this kind are described, for example, in H. Berneth in Ullmann's Encyclopedia of Industrial Chemistry, Azine Dyes, Wiley-VCH Verlag, 2008, H. Berneth in Ullmann's Encyclopedia of Industrial Chemistry, Methine Dyes and Pigments, Wiley-VCH Verlag, 2008, T. Gessner, U. Mayer in Ullmann's Encyclopedia of Industrial Chemistry, Triarylmethane and Diarylmethane Dyes, Wiley-VCH Verlag, 2000.

Particular preference is given to phenazine dyes, phenoxazine dyes, phenothiazine dyes, tri(het)arylmethane dyes—especially diamino- and triamino(het)arylmethane dyes, mono-, di-, triand pentamethinecyanine dyes, hemicyanine dyes, zeromethine dyes—especially naphtholactam dyes, streptocyanine dyes.

Examples of cationic dyes are Astrazon Orange G, Basic Blue 3, Basic Orange 22, Basic Red 13, Basic Violet 7, Methylene Blue, New Methylene Blue, Azure A, 2,4-diphenyl-6-(4-methoxyphenyl)pyrylium, Safranin O, Astraphloxin, Brilliant Green, Crystal Violet, Ethyl Violet and thionine.

Preferred anions are especially $C_8$- to $C_{25}$-alkanesulphonate, preferably $C_{13}$- to $C_{25}$-alkanesulphonate, $C_3$- to $C_{18}$-perfluoroalkanesulphonate, $C_4$- to $C_{18}$-perfluoroalkanesulphonate bearing at least 3 hydrogen atoms in the alkyl chain, $C_9$- to $C_{25}$-alkanoate, $C_9$- to $C_{25}$-alkenoate, $C_8$-to $C_{25}$-alkylsulphate, preferably $C_{13}$- to $C_{25}$-alkylsulphate, $C_8$- to $C_{25}$-alkenylsulphate, preferably $C_{13}$- to $C_{25}$-alkenylsulphate, $C_3$- to $C_{18}$-perfluoroalkylsulphate, $C_4$- to $C_{18}$-perfluoroalkylsulphate bearing at least 3 hydrogen atoms in the alkyl chain, polyether sulphates based on at least 4 equivalents of ethylene oxide and/or 4 equivalents of propylene oxide, bis($C_4$- to $C_{25}$-alkyl, $C_5$- to $C_7$-cycloalkyl, $C_3$- to $C_8$-alkenyl or $C_7$- to $C_{11}$-aralkyl)sulphosuccinate, bis-$C_2$- to $C_{10}$-alkylsulphosuccinate substituted by at least 8 fluorine atoms, $C_8$- to $C_{25}$-alkylsulphoacetates, benzenesulphonate substituted by at least one radical from the group of halogen, $C_4$- to $C_{25}$-alkyl, perfluoro-$C_1$- to $C_8$-alkyl and/or $C_1$- to $C_{12}$-alkoxycarbonyl, naphthalene- or biphenylsulphonate optionally substituted by nitro, cyano, hydroxyl, $C_1$- to $C_{25}$-alkyl, $C_1$- to $C_{12}$-alkoxy, amino, $C_1$- to $C_{12}$-alkoxycarbonyl or chlorine, benzene-, naphthalene- or biphenyldisulphonate optionally substituted by nitro, cyano, hydroxyl, $C_1$- to $C_{25}$-alkyl, $C_1$- to $C_{12}$-alkoxy, $C_1$- to $C_{12}$-alkoxycarbonyl or chlorine, benzoate substituted by dinitro, $C_6$- to $C_{25}$-alkyl, $C_4$- to $C_{12}$-alkoxycarbonyl, benzoyl, chlorobenzoyl or toluoyl, the anion of naphthalenedicarboxylic acid, diphenyl ether disulphonate, sulphonated or sulphated, optionally at least monounsaturated $C_8$- to $C_{25}$-fatty acid esters of aliphatic $C_1$- to $C_8$-alcohols or glycerol, bis(sulpho-$C_2$- to $C_6$-alkyl) $C_3$- to $C_{12}$-alkanedicarboxylates, bis(sulpho-$C_2$- to $C_6$-alkyl) itaconates, (sulpho-$C_2$- to $C_6$-alkyl) $C_6$- to $C_{18}$-alkanecarboxylates, (sulpho-$C_2$- to $C_6$-alkyl) acrylates or methacrylates, triscatechol phosphate optionally substituted by up to 12 halogen radicals, an anion from the group of tetraphenylborate, cyanotriphenylborate, tetraphenoxyborate, $C_4$- to $C_{12}$-alkyltriphenylborate, wherein the phenyl or phenoxy radicals may be substituted by halogen, $C_1$- to $C_4$-alkyl and/or $C_1$- to $C_4$-alkoxy, $C_4$- to $C_{12}$-alkyltrinaphthylborate, tetra-$C_1$- to $C_{20}$-alkoxyborate, 7,8- or 7,9-dicarba-nido-undecaborate(1-) or (2-), which are optionally substituted on the boron and/or carbon atoms by one or two $C_1$- to $C_{12}$-alkyl or phenyl groups, dodecahydrodicarbadodecaborate(2-) or B—$C_1$- to $C_{12}$-alkyl-C-phenyldodecahydrodicarbadodecaborate(1-), where, in the case of polyvalent anions such as naphthalenedisulphonate, $A^-$ represents one equivalent of this anion, and where the alkane and alkyl groups may be branched and/or may be substituted by halogen, cyano, methoxy, ethoxy, methoxycarbonyl or ethoxycarbonyl.

It is also preferable when the anion A of the dye has an AC log P in the range from 1 to 30, more preferably in the range from 1 to 12 and especially preferably in the range from 1 to 6.5. AC log P is computed after J. Comput. Aid. [mol %]Des. 2005, 19, 453; Virtual Computational Chemistry Laboratory, http://www.vcclab.org.

Suitable ammonium alkylarylborates are, for example (Cunningham et al., RadTech'98 North America UV/EB Conference Proceedings, Chicago, Apr. 19-22, 1998): tetrabutylammonium triphenylhexylborate, tetrabutylammonium triphenylbutylborate, tetrabutylammonium trinaphthylhexylborate, tetrabutylammonium tris(4-tert-butyl)phenylbutylborate, tetrabutylammonium tris(3-fluorophenyl)hexylborate hexylborate ([191726-69-9], CGI 7460, product from BASF SE, Basle, Switzerland), 1-methyl-3-octylimidazolium dipentyldiphenylborate and tetrabutylammonium tris (3-chloro-4-methylphenyl)hexylborate ([1147315-11-4], CGI 909, product from BASF SE, Basle, Switzerland).

It may be advantageous to use mixtures of these photoinitiators. According to the radiation source used, the type and concentration of photoinitiator has to be adjusted in the manner known to those skilled in the art. Further details are described, for example, in P. K. T. Oldring (Ed.), Chemistry & Technology of UV & EB Formulations For Coatings, Inks & Paints, vol. 3, 1991, SITA Technology, London, p. 61-328.

It is most preferable when the photoinitiator comprises a combination of dyes whose absorption spectra at least partly cover the spectral range from 400 to 800 nm, with at least one coinitiator matched to the dyes.

It is also preferable when at least one photoinitiator suitable for a laser light colour selected from blue, green and red is present in the photopolymer formulation.

It is also further preferable when the photopolymer formulation contains one suitable photoinitiator each for at least two laser light colours selected from blue, green and red.

Finally, it is most preferable when the photopolymer formulation contains one suitable photoinitiator for each of the laser light colours blue, green and red.

In a further preferred embodiment, the photopolymer formulation additionally contains urethanes as additives, in which case the urethanes may especially be substituted by at least one fluorine atom.

Preferably, the urethanes may have the general formula (III)

in which m≥1 and m≤8 and $R^8$, $R^9$ and $R^{10}$ are is a linear, branched, cyclic or heterocyclic organic radicals which are unsubstituted or else optionally substituted by heteroatoms and/or $R^9$, $R^{10}$ are each independently hydrogen, in which case preferably at least one of the $R^8$, $R^9$, $R^{10}$ radicals is substituted by at least one fluorine atom and, more preferably, $R^8$ is an organic radical having at least one fluorine atom. More preferably, $R^9$ is a linear, branched, cyclic or heterocyclic organic radical which is unsubstituted or else optionally substituted by heteroatoms, for example fluorine.

The present invention further provides a photopolymer comprising matrix polymers, writing monomer and a photoinitiator and further comprising a compound of formula (I)

where
$A^1$, $A^2$ and $A^3$ are each independently hydrogen, fluorine, chlorine, bromine or iodine,
$R^1$, $R^2$, $R^3$, $R^4$ and $R^5$ are each independently hydrogen, halogen, cyano, nitro, amino, alkylimino, azide, isonitrile, enamino, formyl, acyl, carboxyl, carboxylate, carboxamide, orthoester, sulphonate, phosphate, organosulphonyl, organosulphoxidyl, optionally fluorinated alkoxy or an optionally substituted aromatic, heteroaromatic, aliphatic, araliphatic, olefinic or acetylenic radical while suitable radicals may be connected together via bridge of any desired substitution, or in that two or more compounds of formula (I) may be connected together via at least one of the radicals $R^1$, $R^2$, $R^3$, $R^4$ and $R^5$, in which case these radicals therein constitute a 2- to 4-tuply functional bridge, with the proviso that at least one of the radicals $R^1$, $R^2$, $R^3$, $R^4$ and $R^5$ is not hydrogen. In one preferred embodiment of the photopolymer according to the present invention, the compound of formula (I) has $A^1$, $A^2$ and $A^3$ each independently fluorine, chlorine, bromine or iodine and more preferably $A^1$, $A^2$ and $A^3$ all either fluorine, chlorine, bromine or iodine. In a likewise preferred embodiment, $R^1$, $R^2$, $R^3$, $R^4$ and $R^5$ in the compound of formula (I) are each independently hydrogen, halogen, cyano, nitro, isonitrile, acyl, carboxyl, carboxylate, carboxamide, orthoester, sulphonate, phosphate, organosulphonyl, organosulphoxidyl, optionally fluorinated alkoxy and preferably hydrogen, halogen, cyano, nitro, isonitrile, acyl, carboxyl, more preferably hydrogen, halogen and even more preferably hydrogen, fluorine, chlorine, bromine or iodine.

The matrix polymers of the photopolymer formulation according to the present invention may be particularly in a crosslinked state and more preferably in a three-dimensionally crosslinked state.

It is also advantageous for the matrix polymers to be polyurethanes, in which case the polyurethanes may be obtainable in particular by reacting at least one polyisocyanate component with at least one isocyanate-reactive component.

The above remarks concerning further preferred embodiments of the photopolymer formulation according to the present invention also apply mutatis mutandis to the photopolymer of the present invention.

The invention also provides a holographic medium particularly in the form of a film comprising a photopolymer of the present invention or obtainable by using a photopolymer formulation of the present invention. The invention yet further provides for the use of a photopolymer formulation of the present invention in the production of holographic media.

In one preferred embodiment of the holographic medium according to the present invention, holographic information has been exposed into same.

The inventive holographic media can be processed into holograms by means of appropriate exposure processes for optical applications over the entire visible and in the near UV range (300-800 nm). Visual holograms include all holograms which can be recorded by methods known to those skilled in the art. These include in-line (Gabor) holograms, off-axis holograms, full-aperture transfer holograms, white light transmission holograms ("rainbow holograms"), Denisyuk holograms, off-axis reflection holograms, edge-lit holograms and holographic stereograms. Preference is given to reflection holograms, Denisyuk holograms, transmission holograms.

Possible optical functions of the holograms which can be produced with the inventive photopolymer formulations correspond to the optical functions of light elements such as lenses, mirrors, deflecting mirrors, filters, diffuser lenses, diffraction elements, diffusers light guides, waveguides, projection lenses and/or masks. It is likewise possible for combinations of these optical functions to be combined in one hologram independently of each other. These optical elements frequently have a frequency selectivity according to how the holograms have been exposed and the dimensions of the hologram.

In addition, by means of the inventive media, it is also possible to produce holographic images or representations, for example for personal portraits, biometric representations in security documents, or generally of images or image structures for advertising, security labels, brand protection, branding, labels, design elements, decorations, illustrations, collectable cards, images and the like, and also images which can represent digital data, including in combination with the products detailed above. Holographic images can have the impression of a three-dimensional image, but they may also represent image sequences, short films or a number of different objects according to the angle from which and the light source with which (including moving light sources) etc. they are illuminated. Because of this variety of possible designs, holograms, especially volume holograms, constitute an attractive technical solution for the abovementioned application.

The present invention accordingly further provides for the use of an inventive holographic medium for recording of in-line, off-axis, full-aperture transfer, white light transmission, Denisyuk, off-axis reflection or edge-lit holograms and also of holographic stereograms, in particular for production of optical elements, images or image depictions.

The present invention further also provides a process for producing a holographic medium by using a photopolymer formulation of the present invention.

The photopolymer formulations can especially be used for production of holographic media in the form of a film. In this case, a ply of a material or material composite transparent to light within the visible spectral range (transmission greater than 85% within the wavelength range from 400 to 780 nm) as carrier substrate is coated on one or both sides, and a cover layer is optionally applied to the photopolymer ply or plies.

Preferred materials or material composites for the carrier substrate are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulphone, cellulose triacetate (CTA), polyamide, polymethylmethacrylate, polyvinyl chloride, polyvinyl butyral or polydicyclopentadiene or mixtures thereof. They are more preferably based on PC, PET and CTA. Material composites may be film laminates or coextrudates. Preferred material composites are duplex and triplex films formed according to one of the schemes A/B, A/B/A or A/B/C. Particular preference is given to PC/PET, PET/PC/PET and PC/TPU (TPU=thermoplastic polyurethane).

The materials or material composites of the carrier substrate may be given an antiadhesive, antistatic, hydrophobized or hydrophilized finish on one or both sides. The modifications mentioned serve the purpose, on the side facing the photopolymer, of making the photopolymer detachable without destruction from the carrier substrate. Modification of the opposite side of the carrier substrate from the photopolymer serves to ensure that the inventive media satisfy specific mechanical demands which exist, for example, in the case of processing in roll laminators, especially in roll-to-roll processes.

The examples which follow serve to elucidate the invention exemplarily.

EXAMPLES

Test Methods:
OH Number:
Reported OH numbers were determined to DIN 53240-2.
NCO Value:
Reported NCO values (isocyanate contents) were determined to DIN EN ISO 11909.
Determination of Diffraction Efficiency in Pulsed Exposure:
To determine the diffraction efficiency in pulsed exposure, the Denisyuk hologram of a mirror was recorded in a sample consisting of a glass plate laminated with a photopolymer film using the apparatus of FIG. 1. The substrate of the photopolymer film and the glass substrate faced laser source and the mirror, respectively. The sample was exposed with its planar face perpendicular to the laser beam. The distance between the sample and the mirror was 3 cm.

Figure 1:
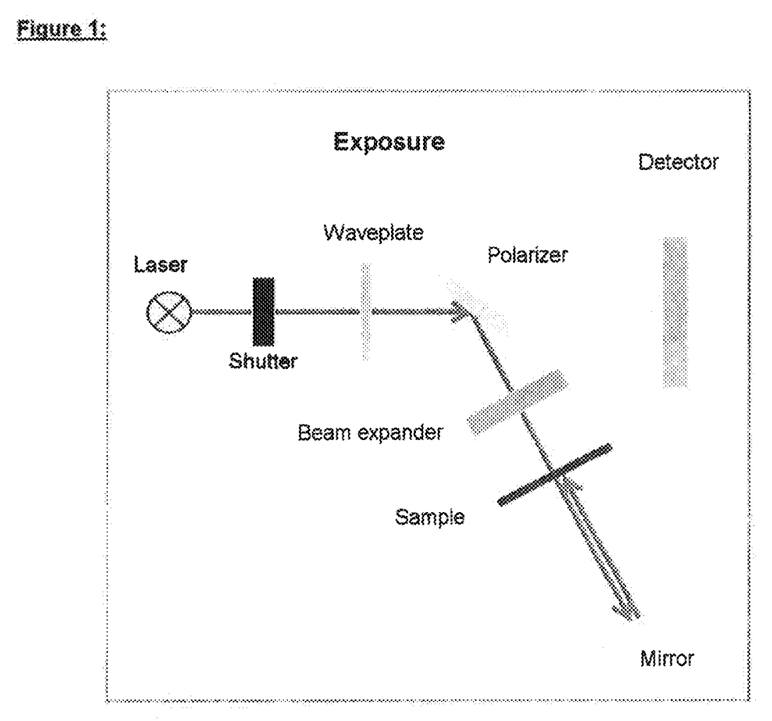
FIG. 1 illustrates the holographic experimental setup.

The laser used was a Brilliant b pulsed laser from Quantel of France. The laser in question was a Q-switched Nd-YAG laser equipped with a module for frequency doubling to 532 nm. The single frequency mode was guaranteed by a seed laser. Coherence length was arithmetically about 1 m. Pulse duration was 4 ns and average power output was 3 watts at a pulse repetition rate of 10 Hz.

The electronically controlled shutter was used to ensure a single pulse exposure. The waveplate made it possible to rotate the polarization plane of the laser light and the subsequent polarizer was used to reflect the S-polarized portion of the laser light in the direction of the sample. The exposed area was adjusted by beam expansion. The waveplate and the beam expander were adjusted such that the sample was given an exposure dose of 100 mJ/cm$^2$/pulse.

To determine the diffraction efficiency, the samples were each exposed with exactly one pulse. After exposure, the sample was bleached on a light table.

Figure 2:
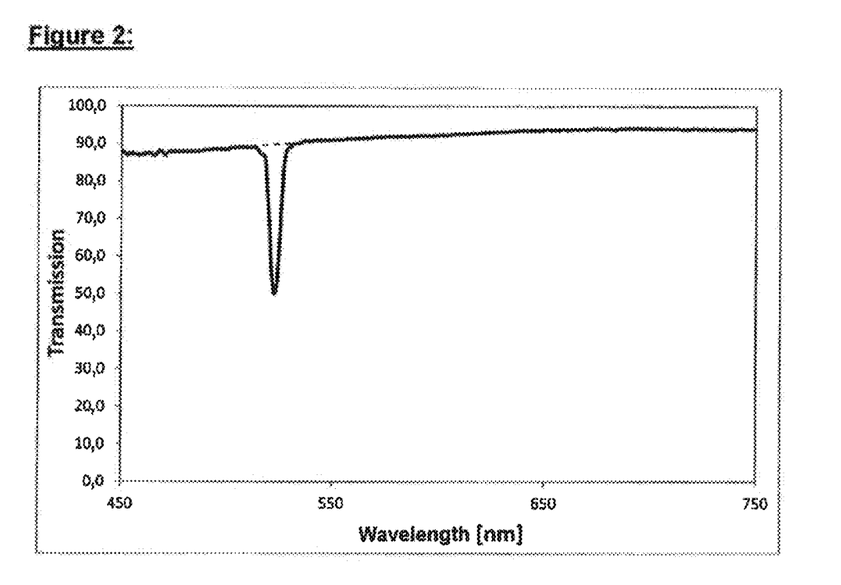
FIG. 2 illustrates the transmission spectrum of the sample of the bleached hologram.

A transmission spectrum was measured through the hologram of the bleached sample and is shown as FIG. 2. An HR4000 spectrometer from Ocean Optics was used. The sample was placed perpendicularly to the light beam. The transmission spectrum showed a transmission collapse at a wavelength at which the Bragg condition was satisfied. The depth of the transmission collapse to the base line was evaluated as the diffraction efficiency DE of the Denisyuk hologram of the mirror.

Substances:
The solvents used were obtained commercially.
Desmorapid Z Dibutyltin dilaurate [77-58-7], product from Bayer MaterialScience AG, Leverkusen, Germany.
Desmodur® N 3900 Product from Bayer MaterialScience AG, Leverkusen, Germany, hexane diisocyanate-based polyisocyanate, proportion of iminooxadiazinedione at least 30%, NCO content: 23.5%.
Fomrez UL 28 Urethanization catalyst, commercial product of Momentive Performance Chemicals, Wilton, Conn., USA.
Aluminium chloride [7446-70-0] is available from Acros Organics, Geel, BE.
1-Chloro-3,4-difluorobenzene [696-02-6] is available from ABCR GmbH & CO. KG, Karisruhe.
1-Bromo-3,4-difluorobenzene [348-61-8] is available from ABCR GmbH & CO. KG, Karlsruhe.
1,4-Difluorobenzene [540-36-3] is available from Aldrich Chemic, Steinheim.
4-Chlorofluorobenzenc [352-33-0] is available from ABCR GmbH & CO. KG, Karlsruhe.
4-Bromofluorobenzene [460-00-4] is available from Aldrich Chemie, Steinheim.
4-Chlorophenylmagnesium bromide [873-77-8] is available as 0.9 M solution in THF/toluene from Aldrich Chemie, Steinheim.
4-Fluorophenylmagnesium bromide [352-13-6] is available as 1.0M solution in THF from Aldrich Chemie, Steinheim.
Tetrabutylammonium bromide [1643-19-2] is available from ABCR GmbH & CO. KG, Karlsruhe.
Safranine O [10309-89-4] is available from Chemos GmbH, Germany, Article No. 1308. The composition of the substance mixture is described in EP 2450893 A1.
Sodium bis(2-ethylhexyl)-[45297-26-5] is available from Aldrich Chemie, Steinheim.
sulphosuccinate ps COMPOUNDS OF THE FORMULA (I)

Example 1

4-Fluorotrichlorobenzene

4-Fluorotrichlorobenzene [402-42-6] is available from ABCR GmbH & CO. KG, Karlsruhe and was used as obtained.

Example 2

Preparation of
1,2,4-trifluoro-5-(trichloromethyl)benzene

In a 250 mL four-necked round-bottom flask equipped with reflux condenser, dropping funnel, internal thermometer and mechanical stirrer, 20.7 g of aluminium trichloride were suspended in 75 mL of carbon tetrachloride under nitrogen. This suspension was admixed with 10.2 g of 1,2,4-trifluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% NaHCO$_3$ solution and a further time with 100 mL of water. The carbon tetrachloride was distilled off and the desired product (5.6 g) crystallized out of the oil in the form of colourless fine needles.

Example 3

Preparation of
1-chloro-4,5-difluoro-2-(trichloromethyl)benzene

In a 250 mL four-necked round-bottom flask equipped with reflux condenser, dropping funnel, internal thermometer and mechanical stirrer, 27.4 g of aluminium trichloride were suspended in 100 mL of carbon tetrachloride under nitrogen. This suspension was admixed with 15.3 g of 1-chloro-3,4-difluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% NaHCO$_3$ solution and a further time with 100 mL of water. The carbon tetrachloride was distilled off and little acetonitrile was added. The desired product (6.0 g) crystallized out of this solution in the form of colourless fine needles.

Example 4

Preparation of 5-chloro-1,2-difluoro-3-(trichloromethyl)benzene

The motherliquor from the synthesis of Example 3 was freed from acetonitrile under reduced pressure and the remaining oil (14.7 g) consisted of the isomeric 5-chloro-1,2-difluoro-3-(trichloromethyl)benzene.

Example 5

Preparation of 1-bromo-4,5-difluoro-2-(trichloromethyl)benzene

In a 250 mL four-necked round-bottom flask equipped with reflux condenser, dropping funnel, internal thermometer and mechanical stirrer, 27.4 g of aluminium trichloride were suspended in 100 mL of carbon tetrachloride under nitrogen. This suspension was admixed with 19.8 g of 1-bromo-3,4-difluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% $NaHCO_3$ solution and a further time with 100 mL of water. The carbon tetrachloride was distilled off and little acetonitrile was added. The desired product (4.4 g) crystallized out of this solution in the form of colourless fine needles.

Example 6

Preparation of 5-bromo-1,2-difluoro-3-(trichloromethyl)benzene

The motherliquor from the synthesis of Example 5 was freed from acetonitrile under reduced pressure and the remaining oil (22.0 g) consisted of the isomeric 5-bromo-1,2-difluoro-3-(trichloromethyl)benzene.

Example 7

Preparation of 1,4-difluoro-2-(trichloromethyl)benzene

In a 250 mL four-necked round-bottom flask equipped with reflux condenser, dropping funnel, internal thermometer and mechanical stirrer, 27.4 g of aluminium trichloride were suspended in 100 mL of carbon tetrachloride under nitrogen. This suspension was admixed with 11.7 g of 1,4-difluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% $NaHCO_3$ solution and a further time with 100 mL of water. The carbon tetrachloride was distilled off and little acetonitrile was added. The desired product (8.0 g) crystallized out of this solution in the form of colourless fine needles.

Example 8

Preparation of 1-chloro-4-fluoro-2-(trichloromethyl) benzene and 4-chloro-1-fluoro-2-(trichloromethyl) benzene In a 250 mL four-necked round-bottom flask equipped with reflux condenser, dropping funnel, internal thermometer and mechanical stirrer, 27.4 g of aluminium trichloride were suspended in 100 mL of carbon tetrachloride under nitrogen. This suspension was admixed with 13.4 g of 4-chlorofluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% $NaHCO_3$ solution and a further time with 100 mL of water. The carbon tetrachloride was distilled off and little acetonitrile was added. A mixture of the desired products 1,4-difluoro-2-(trichloromethyl)benzene and 4-chloro-1-fluoro-2-(trichloromethyl)benzene (17.5 g) came down from this solution in a ratio of about 3:1.

Example 9

Preparation of 1,4-difluoro-2-(trichloromethyl)benzene

In a 250 mL four-necked round-bottom flask equipped with reflux condenser, dropping funnel, internal thermometer and mechanical stirrer, 27.4 g of aluminium trichloride were suspended in 100 mL of carbon tetrachloride under nitrogen. This suspension was admixed with 18.0 g of 4-bromofluorobenzene in a gradual manner, such that the reaction mixture was refluxing gently. The resultant HCl gas was introduced into aqueous sodium hydroxide solution. On completion of the addition the mixture was subsequently stirred for 10 min and then cooled down to room temperature. The reaction mixture was discharged onto 300 mL of ice-water and the organic phase was separated off. The organic phase was washed once with 100 mL of water, once with 100 mL of 5% $NaHCO_3$ solution and a further time with 100 mL of water. The carbon tetrachloride was distilled off and little acetonitrile was added. The desired product (4.6 g) crystallized out of this solution in the form of colourless fine needles.

Preparation of Further Components for the Photopolymer Formulation

Preparation of Polyol 1

A 1 l flask was initially charged with 0.18 g of tin octoate, 374.8 g of t-caprolactone and 374.8 g of a difunctional polytetrahydrofuran polyether polyol (equivalent weight 500 g/mol OH), which were heated to 120° C. and kept at this temperature until the solids content (proportion of nonvolatile constituents) was 99.5% by weight or higher. Subsequently, the mixture was cooled and the product was obtained as a waxy solid.

Preparation of urethane acrylate 1 (writing monomer): Phosphorothloyltrli(oxybenzene-4,1-diylcarbamoyloxyethane-2,1-diyl) trisacrylate A 500 mL round-bottom flask was initially charged with 0.1 g of 2,6-di-tert-butyl-4-methylphenol, 0.05 g of dibutyltin dilaurate (Desmorapid® Z, Bayer MaterialScience AG, Leverkusen, Germany) and 213.07 g of a 27% solution of tris(p-isocyanatophenyl) thiophosphate in ethyl acetate (Desmodur® RFE, product from Bayer MaterialScience AG, Leverkusen, Germany), which were heated to 60° C. Subsequently, 42.37 g of 2-hydroxyethyl acrylate were added dropwise and the mixture was still kept at 60° C. until the isocyanate content had fallen below 0.1%. This was followed by cooling and complete removal of the ethyl acetate under reduced pressure. The product was obtained as a semicrystalline solid.

Preparation of urethane acrylate 2 (writing monomer): 2-(({[3-(Methylsulphanyl)phenyl]carbamoyl}oxy)ethyl prop-2-enoate A 100 mL round-bottom flask was initially charged with 0.02 g of 2,6-di-tert-butyl-4-methylphenol, 0.01 g of Desmorapid® Z, 11.7 g of 3-(methylthio)phenyl isocyanate [28479-1-8], and the mixture was heated to 60° C. Subsequently, 8.2 g of 2-hydroxyethyl acrylate were added dropwise and the mixture was still kept at 60° C. until the isocyanate content had fallen below 0.1%. This was followed by cooling. The product was obtained as a colourless liquid.

Preparation of additive 1 bis(2,2,3,3,4,4,5,5,6,6,7,7-dodecafluoroheptyl)(2,2,4-trimethylhexane-1,6-diyl) biscarbamate A 50 mL round-bottom flask was initially charged with 0.02 g of Desmorapid® Z and 3.6 g of 2,4,4-trimethylhexane 1,6-diisocyanate (TMDI), and the mixture was heated to 60° C. Subsequently, 11.9 g of 2,2,3,3,4,4,5,5,6,6,7,7-dodecafluoroheptan-1-ol were added dropwise and the mixture was still kept at 60° C. until the isocyanate content had fallen below 0.1%. This was followed by cooling. The product was obtained as a colourless oil.

Preparation of borate 1 (photoinitiator): Tetrabutylammonium tris(4-chlorophenyl)(hexyl)borate A solution of 15.4 g of dibromohexylborane*dimethyl sulphide [64770-04-3](prepared as described in Journal of the American Chemical Society (1977), 99, 7097-8) in 25 mL of toluene was admixed at 0° C. with 72 mL of a 0.9 M solution of 4-chlorophenylmagnesium bromide [873-77-8] in THF/toluene by gradual dropwise addition. The reaction mixture was warmed to room temperature over 30 min and then refluxed for 2 h. Subsequently, the solvent was removed in vacuum and the oily residue was dissolved in 400 mL of methanol/water (4:1) and freed from precipitated solid material by filtration. The solution obtained was admixed with 15.6 g of tetrabutylammonium bromide and the precipitated solid material was isolated by filtration and dried in vacuo. A colourless solid material was obtained in an amount of 12.2 g.

Preparation of borate 2 (photoinitiator): Tetrabutylammonium tris(4-fluorophenyl)(hexyl)borate A solution of 12.5 g of dibromohexylborane*dimethyl sulphide [64770-04-3](prepared as described in Journal of the American Chemical Society (1977), 99, 7097-8) in 25 mL of toluene was admixed at 0° C. with 60 mL of a 1.0 M solution of 4-fluorophenylmagnesium bromide [873-77-8] in THF by gradual dropwise addition. The reaction mixture was warmed to room temperature over 30 min and then refluxed for 2 h. Subsequently, the solvent was removed in vacuum and the oily residue was dissolved in 400 mL of methanol/water (4:1) and freed from precipitated solid material by filtration. The solution obtained was admixed with 12.6 g of tetrabutylammonium bromide and the precipitated solid material was isolated by filtration and dried in vacuo. A colourless solid material was obtained in an amount of 10.2 g.

Preparation of Dye 1

5.07 g of anhydrous sodium bis(2-ethylhexyl)sulphosuccinate [45297-26-5] were dissolved in 50 mL of anhydrous ethyl acetate. 4.00 g of the anhydrous dye Safranine O [10309-89-4], composition see EP 2450893 A1, were added. The mixture was stirred at room temperature for 3 h and filtered through a fluted filter. The solvent was removed in vacuo to leave 5.1 g of the dye Safranine O bis(2-ethylhexyl) sulphosuccinate [1374689-68-5] as highly viscous oil.

Production of Media to Determine the Holographic Properties

Example Medium I 3.38 g of polyol component 1 were mixed with 0.010 g of Example 1, 2.00 g of urethane acrylate 1, 2.00 g of urethane acrylate 2, 1.50 g of additive 1, 0.10 g of borate 1, 0.010 g of dye 1 and 0.35 g of N-ethylpyrrolidone at 60° C. to obtain a clear solution. This was followed by cooling to 30° C., admixture of 0.65 g of Desmodur N3900 and renewed mixing. This was finally followed by admixture of 0.01 g of Fomrez UL 28 and renewed brief mixing. The liquid mass obtained was then poured onto a glass plate and covered thereon with a second glass plate. This test specimen was left at room temperature for 12 hours for curing.

Example Medium II

The procedure of Example medium I was repeated except that 0.10 g of borate 2 was used instead of 0.10 g of borate 1.

Example Medium III

The procedure of Example medium I was repeated except that 0.10 g of Example 2 was used instead of 0.10 g of Example 1.

Example Medium IV

The procedure for Example medium I was repeated except that 0.010 g of Example 3 was used instead of 0.010 g of Example 1 and that 0.10 g of borate 2 was used instead of 0.10 g of borate 1.

Example Medium V

The procedure of Example medium I was repeated except that 0.010 g of Example 4 was used instead of 0.010 g of Example 1.

Example Medium VI

The procedure of Example medium I was repeated except that 0.010 g of Example 5 was used instead of 0.010 g of Example 1.

Example Medium VII

The procedure of Example medium I was repeated except that 0.010 g of Example 6 was used instead of 0.010 g of Example 1.

Example Medium VIII

The procedure for Example medium I was repeated except that 0.010 g of Example 7 was used instead of 0.010 g of Example 1 and that 0.10 g of borate 2 was used instead of 0.10 g of borate 1.

Example Medium IX

The procedure for Example medium I was repeated except that 0.010 g of Example 8 was used instead of 0.010 g of Example 1 and that 0.10 g of borate 2 was used instead of 0.10 g of borate 1.

Example Medium X

The procedure of Example medium I was repeated except that 0.010 g of Example 9 was used instead of 0.010 g of Example 1.

Comparative Medium V-1

3.38 g of polyol component 1 were mixed with 2.00 g of urethane acrylate 1, 2.00 g of urethane acrylate 2, 1.50 g of additive 1, 0.10 g of borate 1, 0.010 g of dye 1 and 0.35 g of N-ethylpyrrolidone at 60° C. to obtain a clear solution. This was followed by cooling to 30° C., admixture of 0.65 g of Desmodur N3900 and renewed mixing. This was finally followed by admixture of 0.01 g of Fomrez UL 28 and renewed brief mixing. The liquid mass obtained was then poured onto a glass plate and covered thereon with a second glass plate. This test specimen was left at room temperature for 12 hours for curing.

Comparative Medium V-2

The procedure for comparative medium V-1 was repeated, except that 0.10 g of borate 2 was used instead of 0.10 g of borate 1.

Holographic Testing:

The media obtained as described were tested for their holographic properties by using a measuring arrangement as per FIG. 1 in the manner described above (Determination of diffraction efficiency in pulsed exposure). The following measurements were obtained for DE at a fixed dose of 100 mJ/cm²:

TABLE 1

Holographic assessment of selected examples

| Example medium | Example as per formula (I) | Borate | Single pulse DE [%] |
|---|---|---|---|
| I | 1 | 1 | 22 |
| II | 1 | 2 | 21 |
| III | 2 | 1 | 38 |
| IV | 3 | 2 | 37 |
| V | 4 | 1 | 29 |
| VI | 5 | 1 | 34 |
| VII | 6 | 1 | 19 |
| VIII | 7 | 2 | 24 |
| IX | 8 | 2 | 26 |
| X | 9 | 1 | 27 |

TABLE 2

Holographic assessment of selected comparative media

| Comparative medium | Additive | Borate | Single pulse DE [%] |
|---|---|---|---|
| V-1 | — | 1 | — |
| V-2 | — | 2 | — |

The values found for Example media 1 to X show that the inventive formula (I) compounds used in the photopolymer formulations are very useful in holographic media to be exposed with pulsed laser. Comparative media V-1 and V-2 are free from any formula (I) compound according to the invention and are unsuitable for use in holographic media to be exposed with pulsed laser.

The invention claimed is:

1. A photopolymer formulation comprising matrix polymers, writing monomer and a photoinitiator, and a compound of formula (I)

(I)

where $A^1$, $A^2$ and $A^3$ are each independently hydrogen, fluorine, chlorine, bromine or iodine, wherein $R^1$, $R^2$, $R^3$, $R^4$ and $R^5$ are each independently selected from hydrogen, fluorine, chlorine, bromine or iodine with the proviso that at least one of the radicals $R^1$, $R^2$, $R^3$, $R^4$ and $R^5$ is not hydrogen.

2. The photopolymer formulation according to claim 1, wherein $A^1$, $A^2$ and $A^3$ are all either fluorine, chlorine, bromine or iodine.

3. The photopolymer formulation according to claim 1, wherein the matrix polymers are in a three-dimensionally crosslinked state.

4. The photopolymer formulation according to claim 1, wherein the matrix polymers are polyurethanes.

5. The photopolymer formulation according to claim 4, wherein the polyurethanes are prepared by reacting at least one polyisocyanate component with at least one isocyanate-reactive component.

6. A photopolymer comprising matrix polymers, writing monomer, a photoinitiator, and a compound of formula (I)

(I)

where

A$^1$, A$^2$ and A$^3$ are each independently hydrogen, fluorine, chlorine, bromine or iodine, R$^1$, R$^2$, R$^3$, R$^4$ and R$^5$ are each independently hydrogen, halogen, cyano, isonitrile, carboxamide, orthoester, sulphonate, phosphate, organosulphonyl, organosulphoxidyl, or optionally fluorinated alkoxy, with the proviso that at least one of the radicals R$^1$, R$^2$, R$^3$, R$^4$ and R$^5$ is not hydrogen.

7. The photopolymer according to claim 6, wherein A$^1$, A$^2$ and A$^3$ are each independently fluorine, chlorine, bromine or iodine.

8. The photopolymer according to claim 6, wherein the matrix polymers are in a three-dimensionally crosslinked state.

9. The photopolymer according to claim 6, wherein the matrix polymers are polyurethanes.

10. The photopolymer according to claim 9, wherein the polyurethanes are prepared by reacting at least one polyisocyanate component with at least one isocyanate-reactive component.

11. The holographic medium in the form of a film being formed upon a substrate, comprising the photopolymer according to claim 6.

12. The holographic medium according to claim 11, wherein holographic information has been exposed into the photopolymer.

13. A process comprising providing the holographic medium according to claim 11, and recording using an exposure process to produce at least one of in-line, off-axis, full-aperture transfer, white light transmission, reflection, Denisyuk, off-axis reflection, edge-lit or holographic stereograms, for production of optical elements, images or image depictions.

14. The process according to claim 13, wherein the hologram is written by a pulsed laser.

15. A process for producing the holographic medium according to claim 11, the process comprising applying the photopolymer on a substrate.

16. A photopolymer formulation comprising matrix polymers, writing monomer and a photoinitiator, and a compound of formula (I)

where

A$^1$, A$^2$ and A$^3$ are each independently hydrogen, fluorine, chlorine, bromine or iodine, R$^1$, R$^2$, R$^3$, R$^4$ and R$^5$ are each independently hydrogen, halogen, cyano, isonitrile, carboxamide, orthoester, sulphonate, phosphate, organosulphonyl, organosulphoxidyl, or optionally fluorinated alkoxy,-with the proviso that at least one of the radicals R$^1$, R$^2$, R$^3$, R$^4$ and R$^5$ is not hydrogen, wherein the matrix polymers are polyurethanes and wherein the polyurethanes are prepared by reacting at least one polyisocyanate component with at least one isocyanate-reactive component and wherein the at least one polyisocyanate component is an oligomerized aliphatic and/or cycloaliphatic di- or triisocyanates.

17. A photopolymer formulation comprising matrix polymers, writing monomer and a photoinitiator, and a compound of formula (I)

where

A$^1$, A$^2$ and A$^3$ are each independently hydrogen, fluorine, chlorine, bromine or iodine, R$^1$, R$^2$, R$^3$, R$^4$ and R$^5$ are each independently hydrogen, halogen, cyano, isonitrile, carboxamide, orthoester, sulphonate, phosphate, organosulphonyl, organosulphoxidyl, or optionally fluorinated alkoxy, with the proviso that at least one of the radicals R$^1$, R$^2$, R$^3$, R$^4$ and R$^5$ is not hydrogen, wherein the photoinitiator is a mixture of one or more dyes with ammonium alkylarylborate(s).

* * * * *